US010672872B1

(12) United States Patent
Lee et al.

(10) Patent No.: US 10,672,872 B1
(45) Date of Patent: Jun. 2, 2020

(54) SELF-ALIGNED BASE CONTACTS FOR VERTICAL FIN-TYPE BIPOLAR JUNCTION TRANSISTORS

(71) Applicant: International Business Machines Corporation, Armonk, NY (US)

(72) Inventors: ChoongHyun Lee, Rensselaer, NY (US); Injo Ok, Loudonville, NY (US); Soon-Cheon Seo, Glenmont, NY (US); Seyoung Kim, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/274,825

(22) Filed: Feb. 13, 2019

(51) Int. Cl.
*H01L 29/10* (2006.01)
*H01L 29/737* (2006.01)
(Continued)

(52) U.S. Cl.
CPC .... *H01L 29/1004* (2013.01); *H01L 21/02532* (2013.01); *H01L 21/3086* (2013.01); *H01L 21/324* (2013.01); *H01L 29/0817* (2013.01); *H01L 29/0821* (2013.01); *H01L 29/165* (2013.01); *H01L 29/66242* (2013.01); *H01L 29/7378* (2013.01)

(58) Field of Classification Search
CPC .......... H01L 29/1004; H01L 29/66242; H01L 29/165; H01L 29/7378; H01L 21/3086; H01L 29/0817; H01L 21/02532; H01L 21/324; H01L 29/0821
See application file for complete search history.

(56) References Cited

U.S. PATENT DOCUMENTS 7,851,276 B2    12/2010   Yang et al.
9,293,582 B2    3/2016    Currie
(Continued)

FOREIGN PATENT DOCUMENTS

GB    2425400 A    10/2006

OTHER PUBLICATIONS

Rinus Tek Po Lee et al., "Platinum Germanosilicide as Source/Drain Contacts in P-Channel Fin Field-Effect Transistors (FinFETs)", IEEE Transactions on Electron Devices, Jul. 2009, vol. 56, No. 7.
(Continued)

*Primary Examiner* — Karen Kusumakar
(74) *Attorney, Agent, or Firm* — Vazken Alexanian; Ryan, Mason & Lewis, LLP

(57) ABSTRACT

A method of forming a semiconductor structure includes forming a semiconductor layer stack over a substrate. The stack includes a collector layer of silicon (Si) providing a collector region for one or more bipolar junction transistors (BJTs), an emitter layer of Si providing an emitter region for the BJTs, a base layer of (SiGe) with a first germanium percentage (Ge %) providing a base region for the BJTs, and at least one additional layer of SiGe with a second Ge %. The method also includes forming vertical fins in the stack, and forming a germanium oxide (GeOx) layer over the vertical fins. The method further includes performing a thermal anneal to react at least a portion of the GeOx layer with SiGe having one of the first and second Ge % to form a self-alignment layer providing self-alignment for at least one contact to the base layer.

20 Claims, 14 Drawing Sheets

(51) Int. Cl.
*H01L 29/08* (2006.01)
*H01L 21/308* (2006.01)
*H01L 29/66* (2006.01)
*H01L 21/02* (2006.01)
*H01L 21/324* (2006.01)
*H01L 29/165* (2006.01)

(56) References Cited

U.S. PATENT DOCUMENTS

| | | |
|---|---|---|
| 9,508,711 B2 | 11/2016 | Konrath et al. |
| 10,014,397 B1 | 7/2018 | Jain et al. |
| 10,043,880 B2 | 8/2018 | Pore et al. |
| 2005/0151165 A1* | 7/2005 | Chan .................. H01L 29/1004 |
| | | 257/198 |
| 2018/0158945 A1 | 6/2018 | Morin et al. |

OTHER PUBLICATIONS

Paul I. Bunyk et al., "Architectual Considerations in the Design of a Superconducting Quantum Annealing Processor," IEEE Transactions on Applied Superconductivity, Aug. 2014, vol. 24, No. 4.
C.H. Lee et al., "Oxygen potential engineering of interfacial layer for deep sub-nm EOT high-k gate stacks on Ge," https://ieeexplore.ieee.org/abstract/document/6724545, IEEE International Electron Devices Meeting, 2013.

* cited by examiner

FIG. 2
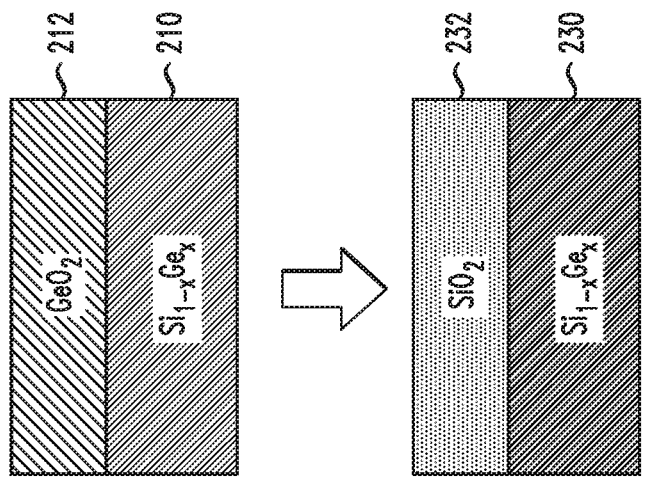
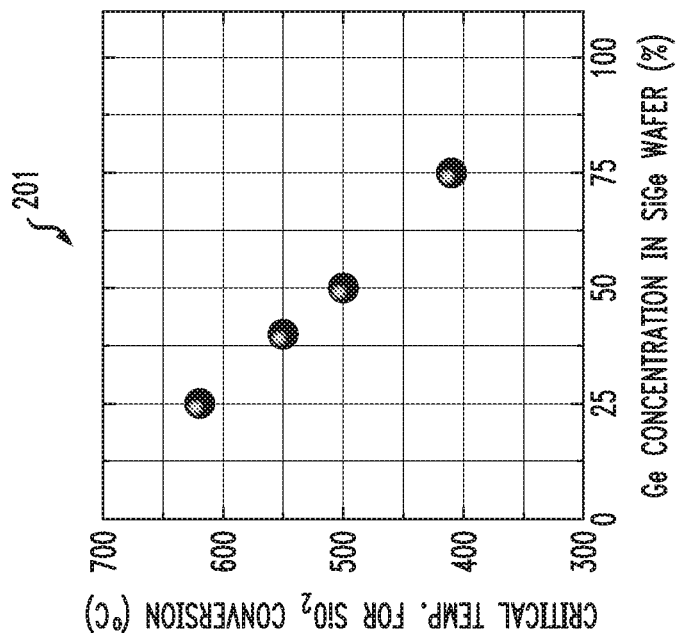

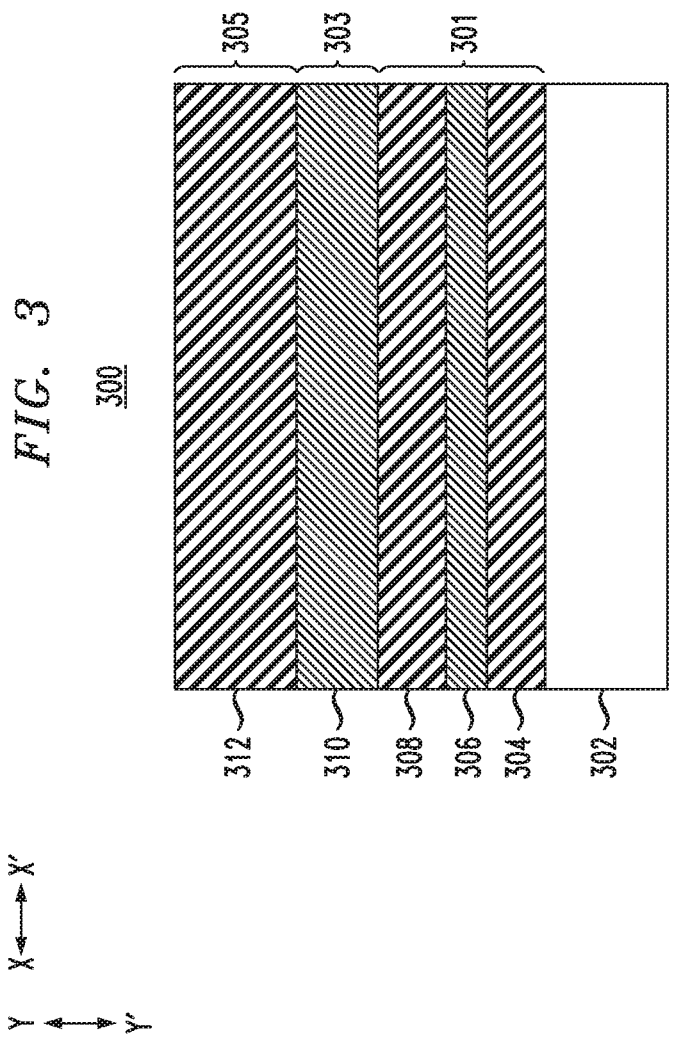

450

400

550

500

650

600

800

700

900

1000

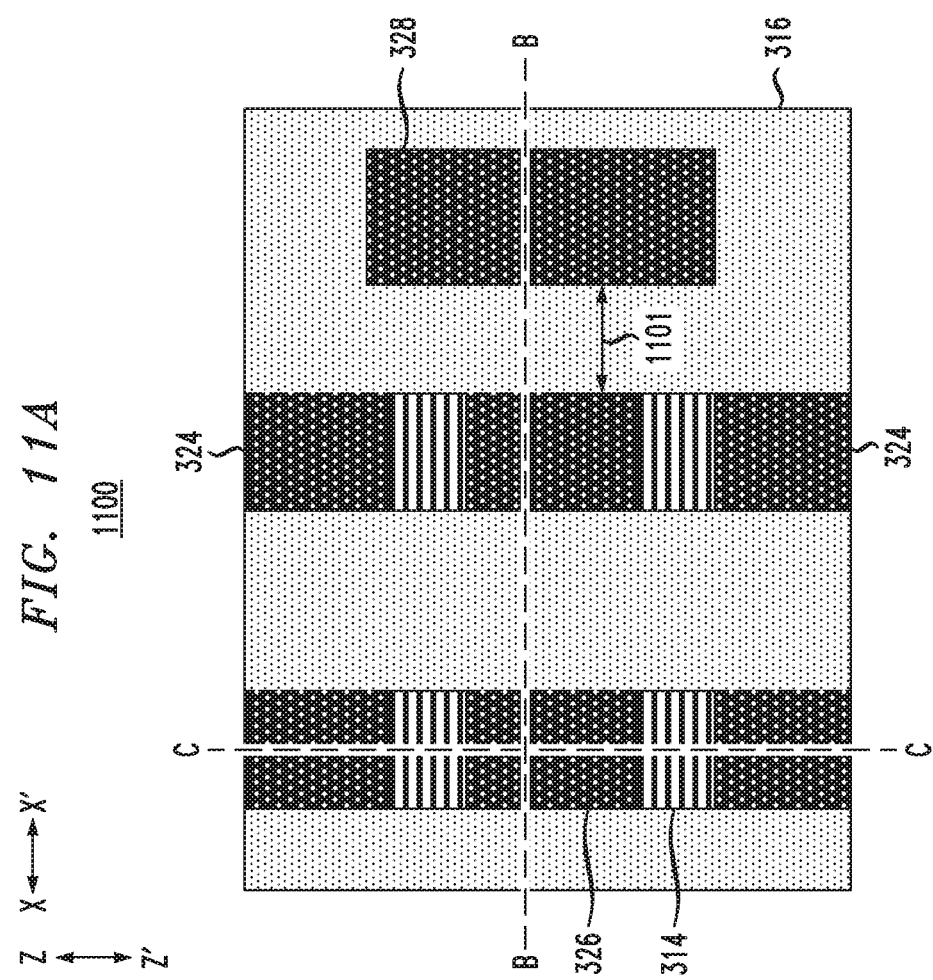

1150

1175

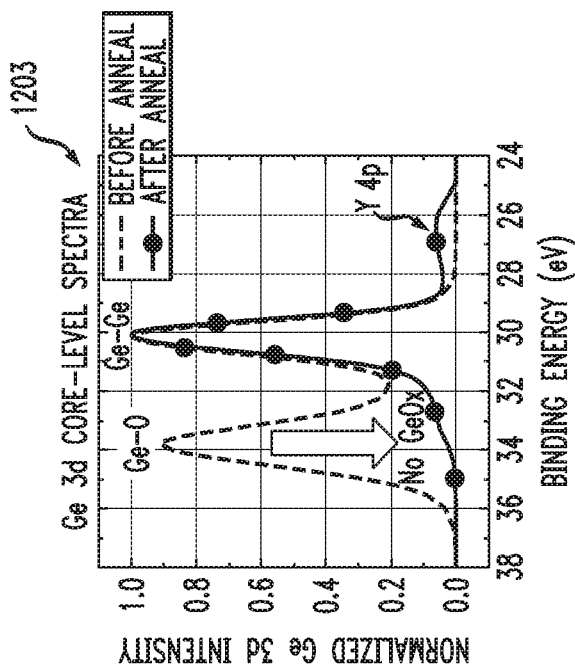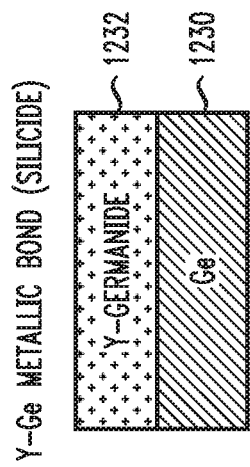
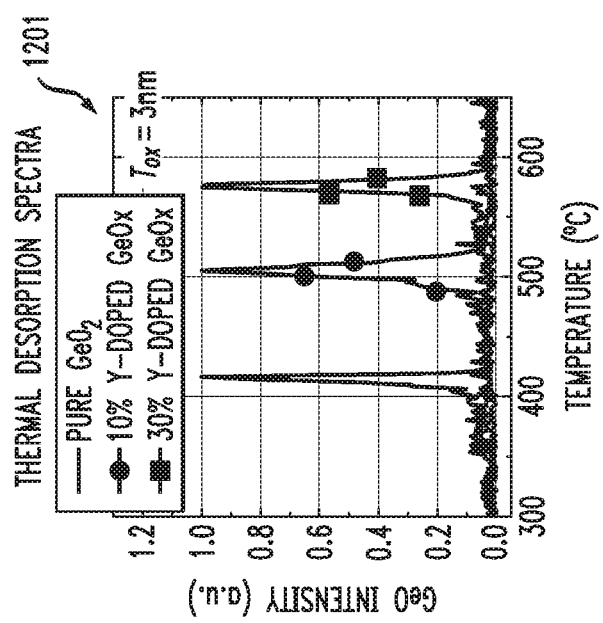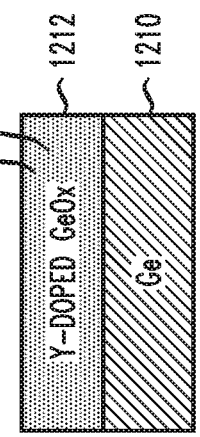
FIG. 12

1400

1500

US 10,672,872 B1

SELF-ALIGNED BASE CONTACTS FOR VERTICAL FIN-TYPE BIPOLAR JUNCTION TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices, such as bipolar junction transistors (BJTs).

SUMMARY

Embodiments of the invention provide techniques for forming self-aligned base contacts for vertical fin-type bipolar junction transistors.

In one embodiment, a method of forming a semiconductor structure comprises forming a semiconductor layer stack over a substrate. The semiconductor layer stack comprises at least one collector layer comprising silicon providing a collector region for one or more bipolar junction transistors, an emitter layer comprising silicon providing an emitter region for the one or more bipolar junction transistors, a base layer comprising silicon germanium with a first germanium percentage providing a base region for the one or more bipolar junction transistors, and at least one additional semiconductor layer comprising silicon germanium with a second germanium percentage different than the first germanium percentage. The method also comprises forming one or more vertical fins in at least a portion of the semiconductor layer stack, and forming a germanium oxide layer over the one or more vertical fins. The method further comprises performing a thermal anneal to react at least a portion of the germanium oxide layer with silicon germanium having one of the first germanium percentage and the second germanium percentage to form a self-alignment layer, the self-alignment layer providing self-alignment for at least one contact to the base layer.

In another embodiment, a semiconductor structure comprises a substrate and one or more vertical fins disposed over a top surface of the substrate. The one or more vertical fins comprise a semiconductor layer stack comprising at least one collector layer comprising silicon providing a collector region for one or more bipolar junction transistors, an emitter layer comprising silicon providing an emitter region for the one or more bipolar junction transistors, a base layer comprising silicon germanium with a first germanium percentage providing a base region for the one or more bipolar junction transistors, and at least one additional semiconductor layer comprising silicon germanium with a second germanium percentage different than the first germanium percentage. The semiconductor structure also comprises a self-alignment layer comprising a reacted portion of a germanium oxide layer and silicon germanium having one of the first germanium percentage and the second germanium percentage, the self-alignment layer providing self-alignment for at least one contact to the base layer.

In another embodiment, an integrated circuit comprises a bipolar junction transistor structure comprising a substrate and one or more vertical fins disposed over a top surface of the substrate. The one or more vertical fins comprise a semiconductor layer stack comprising at least one collector layer comprising silicon providing a collector region for one or more bipolar junction transistors, an emitter layer comprising silicon providing an emitter region for the one or more bipolar junction transistors, a base layer comprising silicon germanium with a first germanium percentage providing a base region for the one or more bipolar junction transistors, and at least one additional semiconductor layer comprising silicon germanium with a second germanium percentage different than the first germanium percentage. The bipolar junction transistor structure further comprises a self-alignment layer comprising a reacted portion of a germanium oxide layer and silicon germanium having one of the first germanium percentage and the second germanium percentage, the self-alignment layer providing self-alignment for at least one contact to the base layer.

BRIEF DESCRIPTION OF THE DRAWINGS

FIG. 2 depicts a temperature dependence of processes for the conversion of germanium oxide to silicon dioxide on a silicon germanium layer, according to an embodiment of the invention.

FIG. 3 depicts a semiconductor stack for forming bipolar junction transistors, according to an embodiment of the invention.

FIG. 11A depicts a top-down view of the FIG. 10 structure following removal of remaining portions of the germanium oxide and following formation of base, emitter and collector contacts, according to an embodiment of the invention.

FIG. 12 depicts temperature-dependent formation of a silicide from a metal-doped germanium oxide and germanium layer stack, according to an embodiment of the invention.

DETAILED DESCRIPTION

Figure 1:
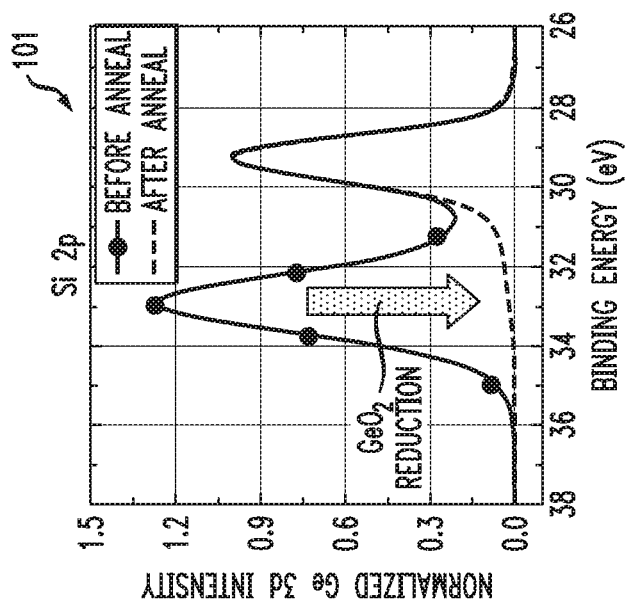
FIG. 1 depicts a process for conversion of germanium oxide to silicon dioxide on a silicon germanium layer, according to an embodiment of the invention.

Illustrative embodiments of the invention may be described herein in the context of illustrative methods for forming self-aligned base contacts for vertical fin-type bipolar junction transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A bipolar junction transistor (BJT) is a three-terminal electronic device including three semiconductor regions referred to as an emitter, a base and a collector. An NPN BJT includes two regions of n-type semiconductor material providing the emitter and collector, and a region of p-type semiconductor material disposed between the two regions of n-type semiconductor material providing the base. A PNP BJT includes two regions of p-type semiconductor material providing the emitter and collector, and a region of n-type semiconductor material disposed between the two regions of p-type semiconductor material providing the base. The differing conductivity types of the emitter, base and collector (in both NPN and PNP type BJTs) form a pair of p-n junctions (e.g., a collector-base junction and an emitter-base junction). A voltage applied across the emitter-base junction of a BJT controls the movement of charge carriers that produce charge flow between the collector and emitter of the BJT.

BJTs may be used in a wide variety of application areas, including for mobile applications and other types of integrated circuits including those designed for high-frequency applications. For example, BJTs may be used in radio frequency integrated circuits (RFICs) found in wireless communications systems, power amplifiers in cellular telephones, and other varieties of high-speed integrated circuits.

Heterojunction bipolar transistors (HBTs) are a type of BJT that uses differing semiconductor materials for the emitter and base regions, thus providing a heterojunction. HBTs may provide various improvements, in that HBTs can handle signals of very high frequencies (e.g., up to several hundred gigahertz (GHz)). HBTs are thus commonly used in circuits such as radio frequency (RF) systems and in applications requiring high power efficiency, such as RF power amplifiers in cellular phones.

In some cases, BJTs may be combined with complementary metal-oxide-semiconductor (CMOS) field-effect transistors (FETs) in bipolar CMOS (BiCMOS) integrated circuits, which provide advantages of the positive characteristics of both BJT and FET transistor types in the construction of an integrated circuit. For example, the combination of silicon germanium (SiGe) HBTs with silicon (Si) CMOS fabrication processes facilitates a SiGe BiCMOS fabrication process that includes both bipolar and metal-oxide-semiconductor (MOS) transistors in a single integrated circuit.

There is a demand for scaling BJT devices, such as for use in mobile applications. It is difficult, however, to scale BJT devices due to the base and collector contact distance being relatively far away from the base so as to prevent shorting between those terminals (e.g., for a planar BJT). Further, it is difficult to make base contacts in vertical fin-type BJTs, as the base is very small.

Lateral and vertical scaling may be used to achieve smaller and faster SiGe HBT devices with greatly increased current densities. Improving both the cutoff frequency ($f_T$) and the maximum frequency of oscillation ($f_{MAX}$) is a significant challenge, as the collector and base dopant concentrations may be increased in a SiGe HBT structure. The increasing current densities of the SiGe HBT puts more emphasis on interconnects as a key factor in limiting transistor layout.

Illustrative embodiment provide techniques for forming self-aligned base contacts for a fin-type three-dimensional (3D) BJT. In some embodiments, this is done without shorting of the emitter or collector to the base, due to (i) selective formation of a dielectric such as silicon dioxide ($SiO_2$) on a sacrificial SiGe collector layer and inner spacer formation; (ii) or selective silicide formation from a metal-doped germanium oxide (GeOx) layer and an underling SiGe layer. Thus, embodiments facilitate highly scaled BJT device formation while resolving the risk of low device yield due to unwanted shorting.

In some embodiments, a reaction of GeOx (e.g., $GeO_2$) and SiGe on a sacrificial SiGe collector layer prevents a short between the base and collector. FIG. 1 illustrates a process for conversion of $GeO_2$ to $SiO_2$ on a SiGe layer. FIG. 1 shows a $GeO_2$ layer 112 formed over a SiGe layer 110. In this example, the SiGe layer 110 has a germanium (Ge) percentage (Ge %) of 40. After an anneal, such as a spike anneal at 600 degrees Celsius (° C.) in an inert gas (e.g., argon (Ar), helium (He), etc.), the $GeO_2$ layer 112 and SiGe layer 110 are converted to a $SiO_2$ layer 134 formed over two SiGe layers 132 and 130. The first SiGe layer 130 has a Ge % of 40, and the second SiGe layer 132 has a Ge % of approximately 60. The original SiGe layer 110 and $GeO_2$ layer 112 react during the anneal, and the Si in the SiGe layer 110 is selectively oxidized forming $SiO_2$ layer 134 due to the lower Gibbs free energy. This conversion is according to:

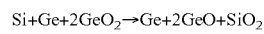

where the Ge on the right-hand side is epitaxial back in to form the second SiGe layer 132, GeO is a volatile species, and the $SiO_2$ is an oxide forming layer 134. Plot 101 illustrates reduction of the $GeO_2$ layer 112, and plot 103 illustrates Si oxidation forming $SiO_2$ layer 134.

FIG. 2 illustrates the temperature dependence of the FIG. 1 process for the conversion of $GeO_2$ to $SiO_2$ on a SiGe layer. FIG. 2 shows a first structure, pre-anneal, including a $Si_{1-x}Ge_x$ layer 210 and a $GeO_2$ layer 212. Subsequent to anneal, the structure includes an $SiO_2$ layer 232 and a $Si_{1-x}Ge_x$ layer 230 where the value of "x" differs from that of $Si_{1-x}Ge_x$ layer 210 (e.g., the value of x may be higher for $Si_{1-x}Ge_x$ layer 230 than $Si_{1-x}Ge_x$ layer 210). In some cases, the $Si_{1-x}Ge_x$ layer 230 may be a SiGe multi-layer with different SiGe layers or portions with different Ge % as shown with layers 130 and 132 of FIG. 1. The plot 201 of FIG. 2 shows the temperature dependence of the process for conversion of $GeO_2$ to $SiO_2$ on a SiGe layer. As illustrated, the conversion is temperature-dependent as a function of Ge concentration in the SiGe layer. There is enough of a process window to selectively form $SiO_2$ only on some SiGe layers and not others (e.g., by controlling the Ge % in such different Ge layers).

FIG. 3 shows a cross-sectional view 300 of a semiconductor stack including a substrate 302, a first highly-doped semiconductor layer 304, a sacrificial semiconductor layer 306, a second highly-doped semiconductor layer 308, a lightly-doped semiconductor layer 310 and a third highly-doped semiconductor layer 312. In the description below it is assumed that the substrate 302, first highly-doped semiconductor layer 304, second highly-doped semiconductor layer 308 and third highly-doped semiconductor layer 312 are formed of Si, and that sacrificial semiconductor layer 306 and lightly-doped semiconductor layer 310 are formed of SiGe.

The semiconductor stack of FIG. 3 will be used to form one or more BJTs as described in further detail below. To form NPN BJTs, the highly-doped semiconductor layers 304, 308 and 312 may be n+-doped Si and the lightly-doped semiconductor layer 310 may be p-type SiGe. To form PNP BJTs, the highly-doped semiconductor layers 304, 308 and 312 may be p+-doped Si and the lightly-doped semiconductor layer 310 may be n-type SiGe. By "highly-doped," it is meant that the layers 304, 308 and 312 have a dopant concentration in the range of about $1e18/cm^3$ to about $1e19/cm^3$, or about $1e19/cm^3$ to about $1e20/cm^3$. By "lightly-doped," it is meant that the layer 310 has a dopant concentration in the range of about $1e14/cm^3$ to about $1e15/cm^3$, or about $1e15/cm^3$ to about $1e15/cm^3$.

In the description below, it is assumed that the semiconductor stack of FIG. 3 is used to form NPN BJTs using Si and SiGe for the layers 302 through 312. As noted above, however, different doping types may be used to form PNP BJTs, and embodiments are not limited to use with Si and SiGe material types.

The layers 304 through 312 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

The layers 302 through 312 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of BJT that is to be formed (e.g., NPN or PNP as discussed above).

The substrate 302 may have a height or vertical thickness (in direction Y-Y') ranging from about 1 nanometer (nm) to 10 nm, or about 10 nm to 100 nm. The substrate 302 may have a width or horizontal thickness (in direction X-X') that ranges as desired, such as based on the number of vertical "fins" that are to be formed as described in further detail below.

The first highly-doped semiconductor layer 304, which may also be referred to as a highly-doped Si layer 304 or collector layer 304, provides a portion of the collector 301 for BJTs formed from the semiconductor stack of FIG. 3. The highly-doped Si layer 304 may have a height or vertical thickness (in direction Y-Y') ranging from about 1 nm to 10 nm, or about 10 nm to 100 nm.

The sacrificial semiconductor layer 306, which may also be referred to as a sacrificial SiGe layer 306, is a sacrificial layer. The sacrificial SiGe layer 306 may have a height or vertical thickness (in direction Y-Y') ranging from about 1 nm to 10 nm, or about 10 nm to 100 nm.

The second highly-doped semiconductor layer 308, which may also be referred to as a highly-doped Si layer 308 or collector layer 308, provides another portion of the collector 301 for BJTs formed form the semiconductor stack of FIG. 3. The highly-doped Si layer 308 may have a height or vertical thickness (in direction Y-Y') ranging from about 1 nm to 10 nm, or about 10 nm to 100 nm.

The lightly-doped semiconductor layer 310, which may also be referred to as a lightly-doped SiGe layer 310 or base layer 310, provides the base 303 for BJTs formed from the semiconductor stack of FIG. 3. The lightly-doped SiGe layer 310 may have a height or vertical thickness (in direction Y-Y') ranging from about 1 nm to 10 nm, or about 10 nm to 100 nm.

The sacrificial SiGe layer 306 and lightly-doped SiGe layer 310 have different Ge %, such that portions of the sacrificial SiGe layer 306 may be reacted with $GeO_2$ to form a bottom spacer for BJTs formed from the semiconductor stack of FIG. 3. The sacrificial SiGe layer 306 may have a relatively "high" Ge % while the lightly-doped SiGe layer 310 may have a relatively "low" Ge %. For example, the Ge % of the sacrificial SiGe layer 306 may be approximately 20% higher than the Ge % of the lightly-doped SiGe layer 310. Advantageously, this 20% difference allows for a process margin of approximately 100° C. for the conversion of $GeO_2$ and SiGe to $SiO_2$ as described above with respect to FIGS. 1 and 2.

The third highly-doped semiconductor layer 312, which may also be referred to as a highly-doped Si layer 312 or emitter layer 312, provides the emitter 305 for BJTs formed from the semiconductor stack of FIG. 3. The highly-doped Si layer 312 may have a height or vertical thickness (in direction Y-Y') ranging from about 1 nm to 10 nm, or about 10 nm to 100 nm.

Figure 4B:
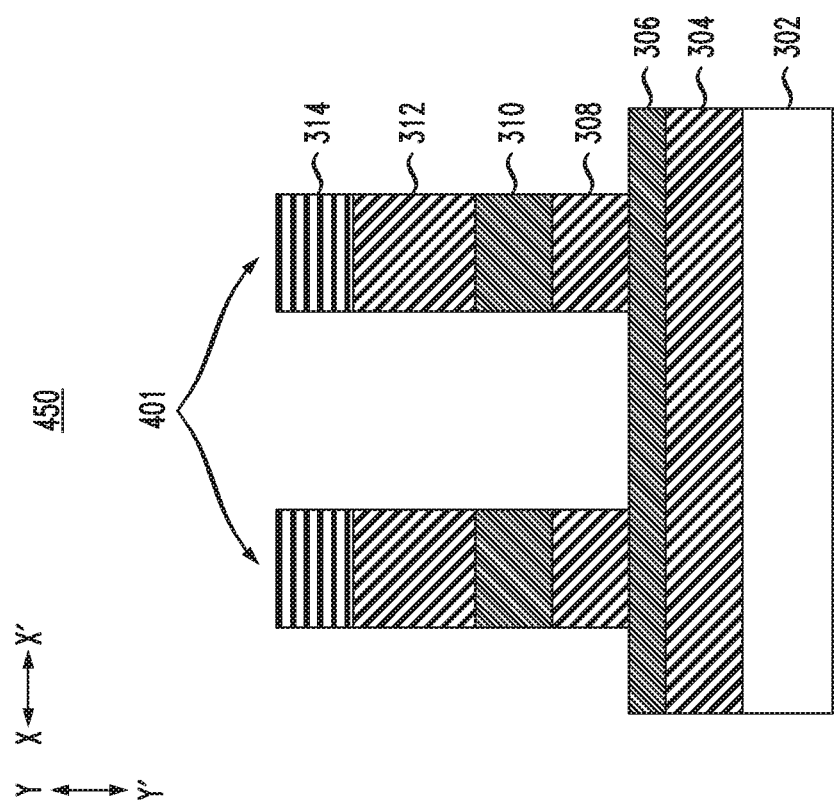
FIG. 4B depicts a cross-sectional view of the FIG. 3 structure following formation of the vertical fins, according to an embodiment of the invention.
Figure 4A:
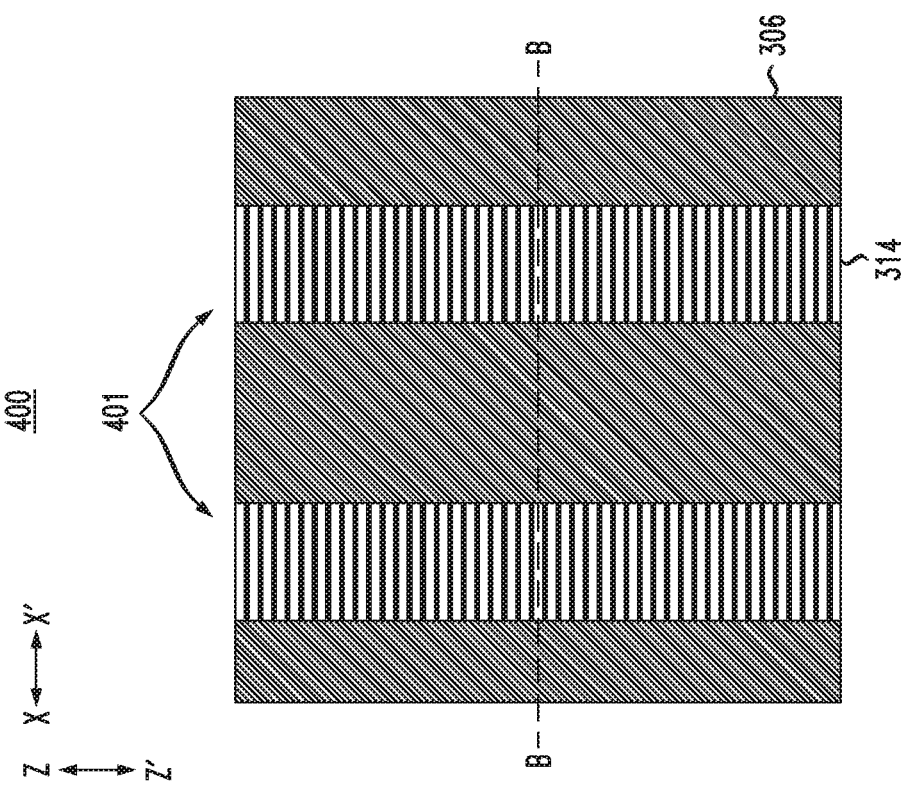
FIG. 4A depicts a top-down view of the FIG. 3 structure following formation of vertical fins, according to an embodiment of the invention.

FIG. 4A shows a top-down view 400 of the semiconductor stack of FIG. 3 following formation of vertical fins 401. FIG. 4B shows a cross-sectional view 450 taken along the line B-B in the top-down view 400 of FIG. 4A (e.g., across the fins 401). As illustrated in FIGS. 4A and 4B, a hard mask layer 314 is patterned over the semiconductor stack of FIG. 3, and the semiconductor stack is then etched to form the vertical fins 401. The vertical fins 401 may be formed by etching through the highly-doped Si layer 312, the lightly-doped SiGe layer 310 and the highly-doped Si layer 308, stopping at the sacrificial SiGe layer 306. These layers may be etched using reactive-ion etching (RIE) or another suitable process.

The hard mask layer 314 may be formed of a nitride such as silicon nitride (SiN), although other suitable materials may be used. In some embodiments, the hard mask layer 314 is formed as a multi-layer, such as a multi-layer of two layers including a nitride and oxide (e.g., SiN and $SiO_2$), a multi-layer of three layers including one or more nitride and one or more oxide layers (e.g., $SiN/SiO_2/SiN$, $SiO_2/SiN/SiO_2$), etc. The hard mask layer 314 may have a height or vertical thickness (in direction Y-Y') in the range of about 10 nm to 200 nm.

Each of the vertical fins 401 may have a width or horizontal thickness (in direction X-X') of 20 nm or greater, or more generally in the range of about 10 nm to 100 nm.

Figure 5B:
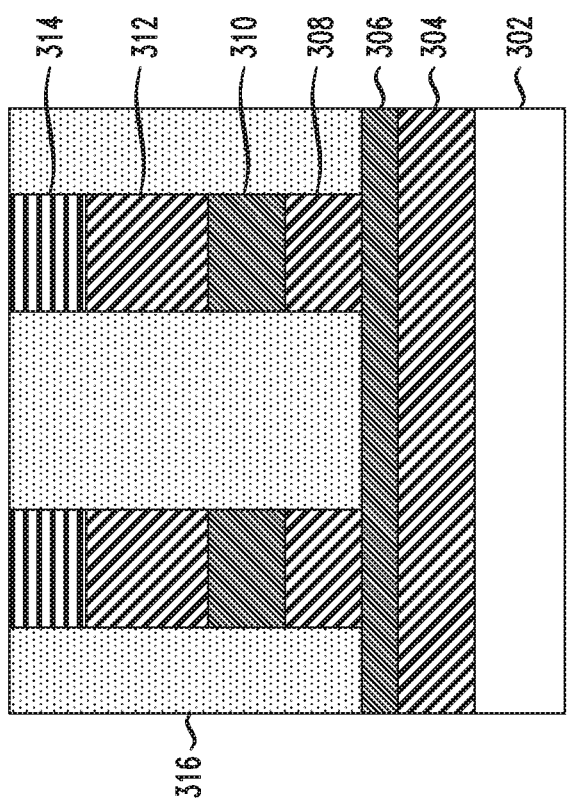
FIG. 5B depicts a cross-sectional view taken across the vertical fins of the structure shown in FIGS. 4A and 4B following formation of the oxide, according to an embodiment of the invention.
Figure 5A:
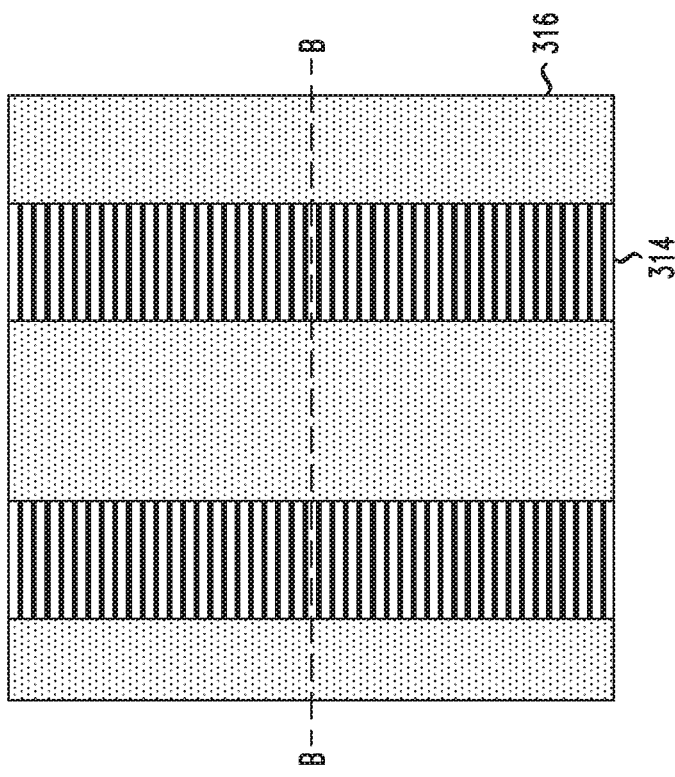
FIG. 5A depicts a top-down view of the structure shown in FIGS. 4A and 4B following formation of an oxide, according to an embodiment of the invention.

FIG. 5A shows a top-down view 500 of the structure shown in FIGS. 4A and 4B following formation of an oxide 316. FIG. 5B shows a cross-sectional view 550 taken along the line B-B in the top-down view 500 of FIG. 5A (e.g., across the vertical fins 401). The oxide 316 may be referred to herein as field oxide 316. The oxide 316 may be formed of $SiO_2$ or another suitable material. The oxide 316 may be formed by filling the structure with an oxide, and then planarizing (e.g., using chemical mechanical planarization (CMP)) to stop at the top surface of the hard mask layer 314.

Figure 6B:
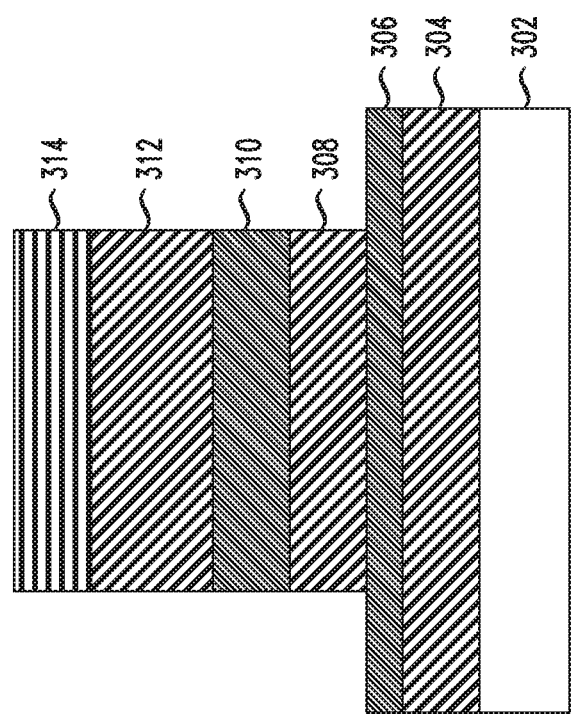
FIG. 6B depicts a cross-sectional view taken along one of the vertical fins of the structure shown in FIGS. 5A and 5B following the fin cut, according to an embodiment of the invention.
Figure 6A:
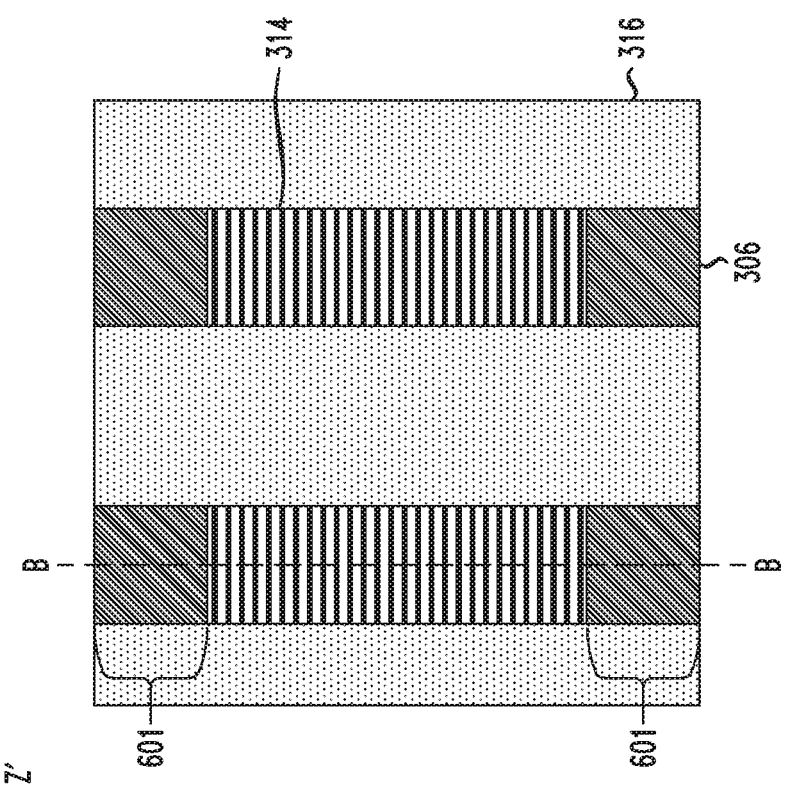
FIG. 6A depicts a top-down view of the structure shown in FIGS. 5A and 5B following a fin cut, according to an embodiment of the invention.

FIG. 6A shows a top-down view 600 of the structure shown in FIGS. 5A and 5B following a fin cut process. FIG. 6B shows a cross-sectional view 650 taken along the line B-B in the top-down view 600 of FIG. 6A. Whereas the cross-sectional views 450 and 550 of FIGS. 4B and 5B were taken "across" or perpendicular to the vertical fins 401, the cross-sectional view 650 of FIG. 6B is taken "along" or parallel to one of the vertical fins 401. The fin cut process is along the vertical fin 401 direction, and is performed by patterning the hard mask layer 314 at the ends of the vertical fins (e.g., in regions 601 shown in the top-down view 600 of FIG. 6A). The underlying layers (e.g., highly-doped Si layer 312, lightly-doped SiGe layer 310 and highly-doped Si layer 308) are then etched (e.g., using RIE or another suitable process) to expose the sacrificial SiGe layer 306. The length of the fin cut or regions 601 (in direction Z-Z') may be in the range of about 0.1 micrometers (μm) to 10 μm.

Figure 7:
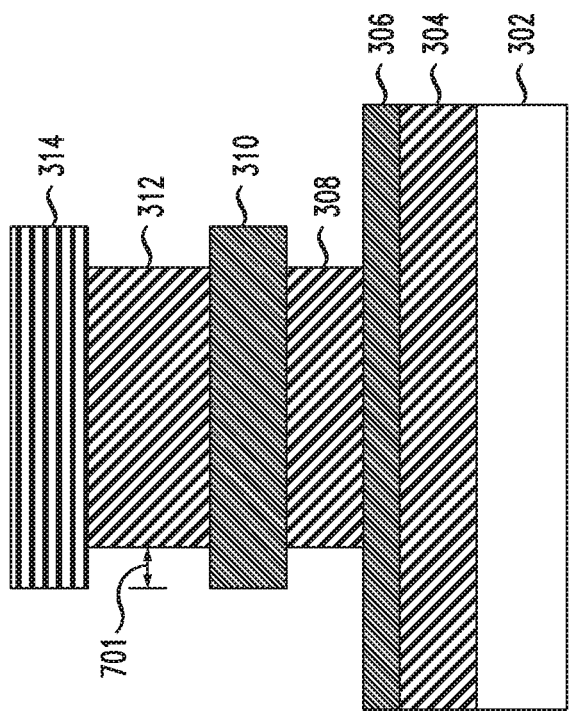
FIG. 7 depicts a cross-sectional view of the structure shown in FIGS. 6A and 6B following recess of the collector and emitter layers, according to an embodiment of the invention.

FIG. 7 shows a cross-sectional view 700 of the structure shown in FIGS. 6A and 6B, following recess of the highly-doped Si layer 312 and the highly-doped Si layer 308. These Si layers may be selectively recessed by a wet or dry chemical etch, such as using a potassium hydroxide (KOH) etch, a nitrogen trifluoride ($NF_3$) etch, etc. As illustrated in FIG. 7, the etch undercuts the sidewalls of the hard mask layer 314 and lightly-doped SiGe layer 310 to a depth 701 in the range of about 2 nm to 20 nm, facilitating the formation of inner spacers as will be described in further detail below.

Figure 8:
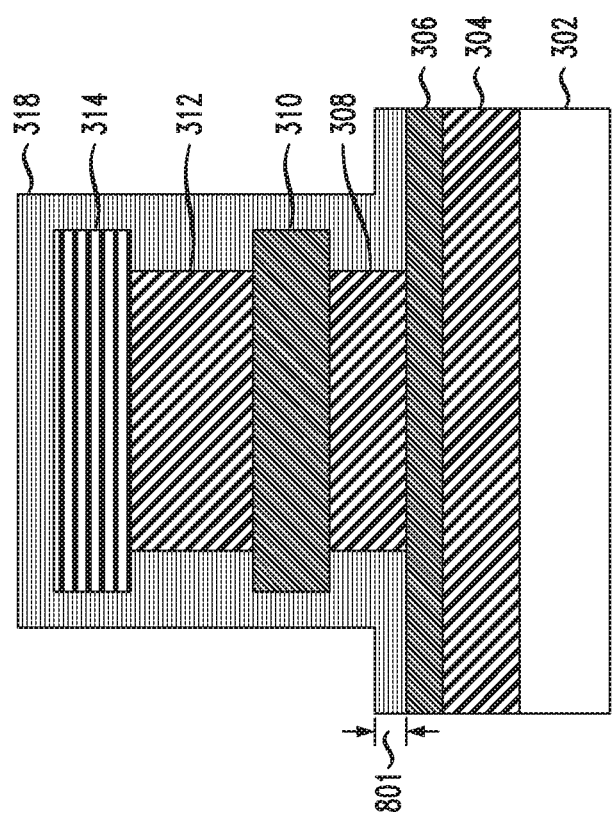
FIG. 8 depicts a cross-sectional view of the FIG. 7 structure following deposition of an inner spacer material, according to an embodiment of the invention.

FIG. 8 shows a cross-sectional view 800 of the FIG. 7 structure following deposition of inner spacer material 318. The inner spacer material 318 may be formed using a conformal deposition process, such as using atomic layer deposition (ALD) or another suitable blanket deposition process. Due to the pinch-off, the recessed regions of the highly-doped Si layer 312 and highly-doped Si layer 308 have a thicker (in direction Z-Z') amount of inner spacer material 318. The inner spacer material 318 may be formed of SiN or another suitable material such as silicon boron carbide nitride (SiBCN), aluminum nitride (AlN), hafnium oxide (HfO2), etc. The thickness of the inner spacer material 318 formed over the top of the sacrificial SiGe layer 306 (e.g., thickness 801) may be in the range of about 5 nm to 50 nm. The thickness of the inner spacer material 318 adjacent the recessed portions of the highly-doped Si layer 312 and highly-doped Si layer 308 may be approximately twice the thickness 801 (more generally, the thickness 701 plus the thickness 801).

The inner spacer material 318, as noted above, may be blanket deposited, and thus would be formed over the field oxide 316 surrounding the vertical fins 401 as well though top-down and cross-sectional views of such are not shown.

Figure 9:
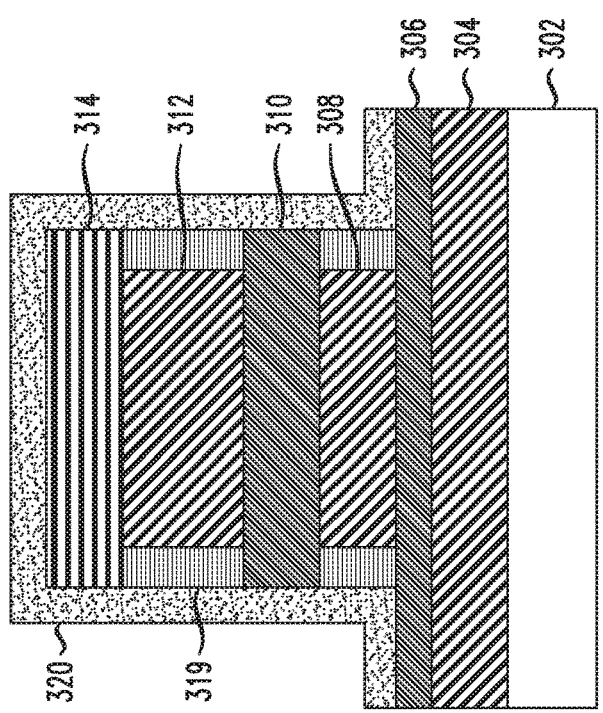
FIG. 9 depicts a cross-sectional view of the FIG. 8 structure following formation of inner spacers and deposition of germanium oxide, according to an embodiment of the invention.

FIG. 9 shows a cross-sectional view 900 of the FIG. 8 structure following formation of inner spacers 319 from the inner spacer material 318 by etch-back of the inner spacer material 318. The etch-back may utilize RIE or other suitable processing, such that the inner spacer material 318 (e.g., SiN) remains only in the spaces formed by recess of the highly-doped Si layer 312 and highly-doped Si layer 308 as described above with respect to FIG. 7.

FIG. 9 further shows a $GeO_2$ layer 320 deposited after formation of the inner spacers 319. The $GeO_2$ layer 320 may be formed using a conformal deposition process, such as ALD or another suitable blanket deposition process. The $GeO_2$ layer 320 may have a uniform thickness in the range of 3 nm to 10 nm. The $GeO_2$ layer 320 may be blanket deposited, and thus would be formed over the field oxide 316 surrounding the vertical fins 401 though top-down and cross-sectional views of such are not shown.

Figure 10:
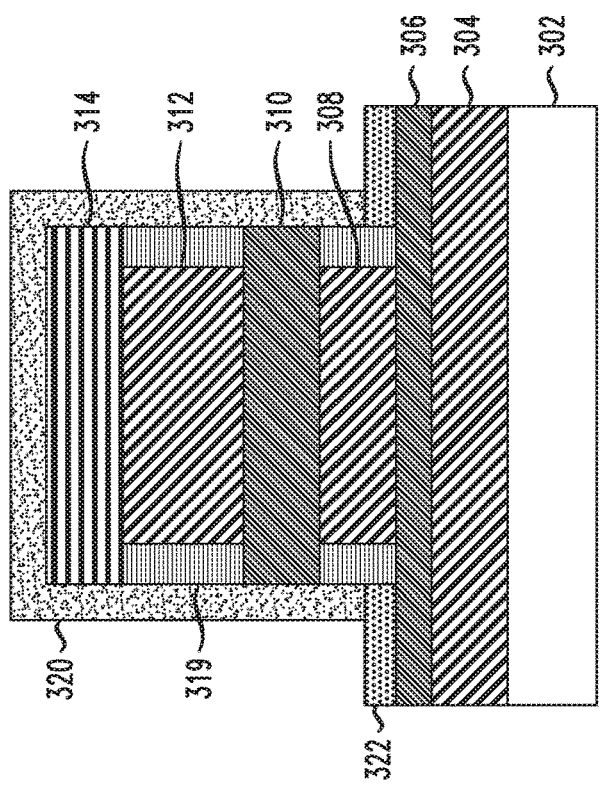
FIG. 10 depicts a cross-sectional view of the FIG. 9 structure following formation of bottom spacers, according to an embodiment of the invention.

FIG. 10 shows a cross-sectional view 1000 of the FIG. 9 structure following formation of bottom spacers 322 through conversion of portions of the $GeO_2$ layer 320 adjacent the sacrificial SiGe layer 306. This may be achieved using a spike anneal in an ambient nitrogen ($N_2$) environment, or in an inert gas such as Ar, He, etc. The spike anneal may be at a temperature in the range of 500° C. to 700° C. as determined based on the Ge % of the sacrificial Ge layer 306. Recall from the discussion of FIG. 2 that the process for conversion of $GeO_2$ formed on a SiGe layer to $SiO_2$ exhibits a temperature dependence that is a function of Ge %. Thus, the Ge % of the sacrificial SiGe layer 306 and the lightly-doped SiGe layer 310 may be suitably selected such that the anneal will form $SiO_2$ bottom spacers 322 only on the sacrificial SiGe layer 304 and not at interfaces of the $GeO_2$ layer 320 and the lightly-doped SiGe layer 310.

Figure 11B:
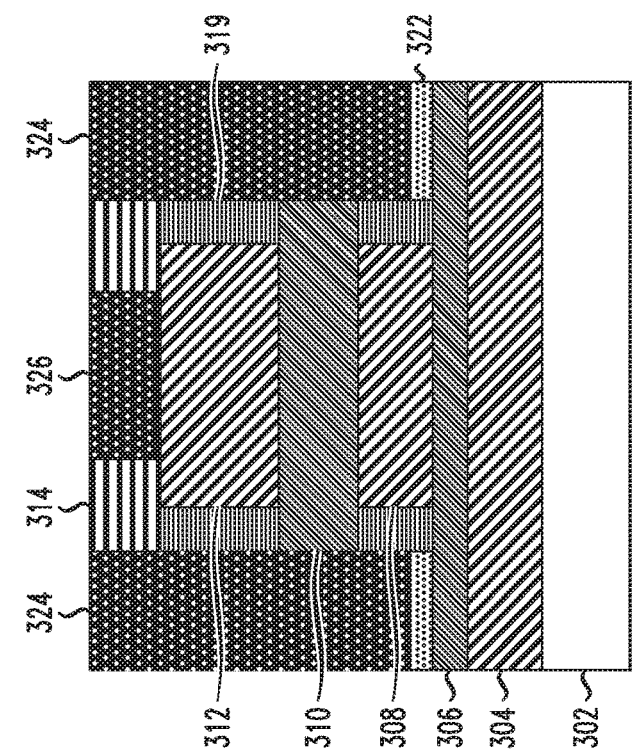
FIG. 11B depicts a first cross-sectional view of the FIG. 12 structure following removal of remaining portions of the germanium oxide and following formation of base, emitter and collector contacts, according to an embodiment of the invention.
Figure 11C:
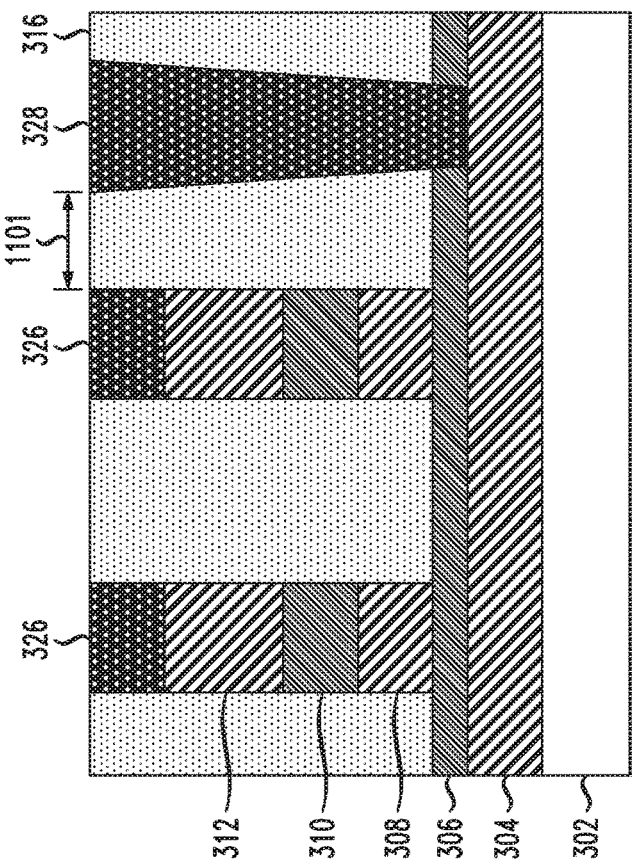
FIG. 11C depicts a second cross-sectional view of the FIG. 12 structure following removal of remaining portions of the germanium oxide and following formation of base, emitter and collector contacts, according to an embodiment of the invention.

FIG. 11A depicts a top-down view 1100 of the FIG. 10 structure following removal of the unreacted portions of the $GeO_2$ layer 320 (e.g., by etching the remaining unreacted portions of the $GeO_2$ layer 320 using a distilled water wash) and following formation of base contacts 324, emitter contacts 326, and collector contact 328. FIG. 11B shows a first cross-sectional view 1150 taken along the line B-B in the top-down view 1100 of FIG. 11A (e.g., across or perpendicular to the vertical fins 401). FIG. 11C shows a second cross-sectional view 1175 taken along the line C-C in the top-down view 1100 of FIG. 11A (e.g., along or parallel to one of the vertical fins 401).

The base contacts 324 may be formed by fill with a contact material and planarization (e.g., using CMP) stopping on the top surface of the hard mask layer 314. The contact material may be a metal such as tungsten (W), copper (Cu), aluminum (Al), cobalt (Co), nickel (Ni), titanium nitride (TiN), tantalum nitride (TaN), etc.

The emitter contacts 326 may be formed by selective removal of portions of the hard mask layer 314 followed by fill and planarization (e.g., using CMP) of the contact material.

The collector contact 328 may be formed by patterning a mask layer over the top surface of the structure (e.g., top surfaces of the emitter contacts 326, base contacts 324, field oxide 316 and remaining portions of the hard mask layer 314) that exposes a portion of the field oxide 316 that is spaced apart (in direction X-X') from the vertical fins. The distance 1101 between the nearest edge of one of the vertical fins 401 and an edge of the opening for forming the collector contact 328 may be in the range of about 20 nm to 200 nm. Portions of the field oxide 316 exposed by the mask may be removed using RIE or another suitable process. The collector contact 328 may then be formed by fill with the contact material and planarization (e.g., using CMP) of the contact material.

Although the formation of the base contacts 324, emitter contacts 326 and collector contact 328 are described above as being performed sequentially, this is not a requirement. In some embodiments, the order of formation of the base contacts 324, emitter contacts 326 and collector contact 328 may be varied.

Processes for forming a self-aligned silicide on a base region of a BJT while avoiding emitter/collector to base shorting will now be described. In some embodiments, this is achieved by using the transition of dielectric to metallic material properties of metal-doped GeOx. Advantageously, this can resolve the risk of low device yield in highly-scaled BJT formation by avoiding shorts between the base region and emitter or collector regions.

In some embodiments, a metal-doped GeOx liner is utilized, where the metal may be yttrium (Y), hafnium (Hf), aluminum (Al), scandium (Sc), lanthanum (La), etc. While various embodiments are described below with respect to utilizing Y-doped GeOx, it should be appreciated that other types of metal-doped GeOx may be used.

As the concentration of Y in GeOx (e.g., $GeO_2$) increases, the dielectric properties also increase. For example, the relative dielectric constant of $GeO_2$ may range from 6 with 0% Y, to 8 with 10% Y, to 9 with 30% Y. The equivalent oxide thickness (EOT) in nm may also decrease as the Y concentration increases. Capacitance and gate voltage properties also improve for Y-doped $GeO_2$, thus Y-doped GeOx may be considered a dielectric material.

Y-doped GeOx may also be used to form a silicide on a Ge layer as illustrated in FIG. 12. FIG. 12 shows a structure including a SiGe layer 1210 and a Y-doped GeOx layer 1212 prior to a thermal anneal. Plot 1201 illustrates the thermal desorption spectra as a function of temperature for pure $GeO_2$ as compared to 10% Y-doped GeOx and 30% Y-doped GeOx. This temperature dependence may be utilized to selectively form a Y-silicide on Ge by appropriately selecting the Y concentration and the temperature of the anneal. FIG. 12 shows the structure after thermal anneal as well, where the Ge layer 1230 is now topped with a Y-Germanide layer 1232 (e.g., a silicide with Y—Ge metallic bonds). Plot 1203 illustrates Ge core-level spectra before and after the thermal anneal thus illustrating the Y-silicide formation.

Figure 13:
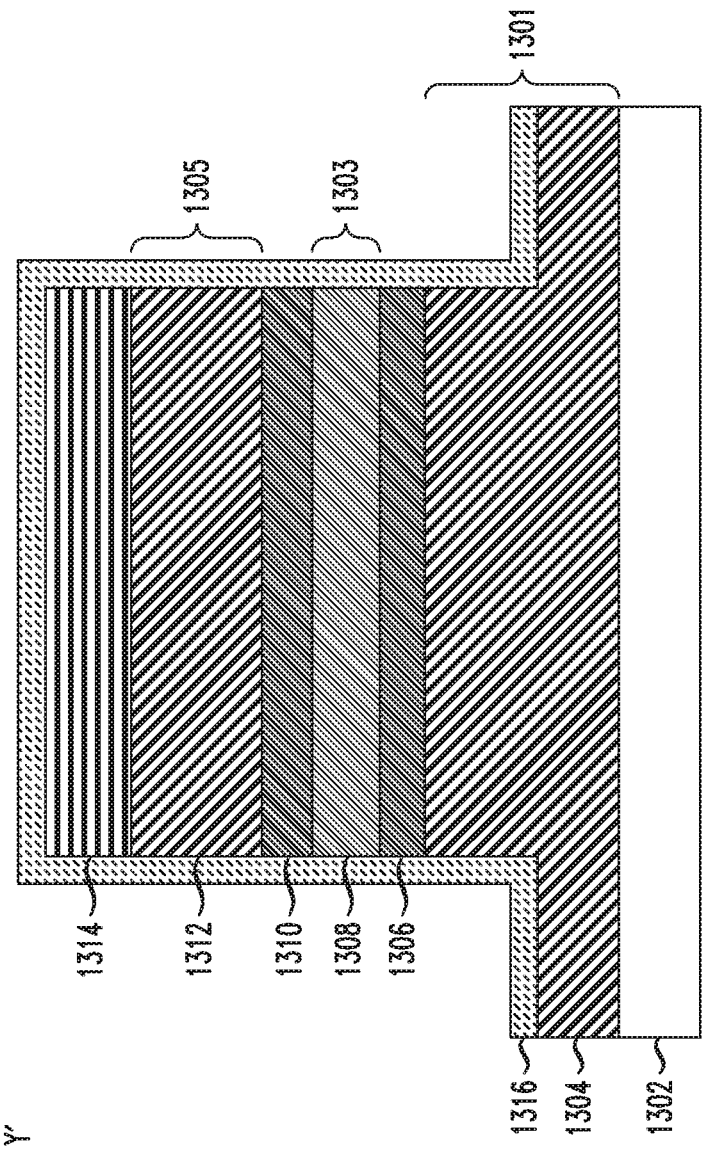
FIG. 13 depicts a cross-sectional view of a semiconductor layer stack following fin patterning and deposition of a metal-doped germanium oxide layer, according to an embodiment of the invention.

FIG. 13 shows a cross-sectional view 1300 of a semiconductor layer stack, following fin patterning and deposition of a metal-doped $GeO_2$ layer 1316. The cross-sectional view 1300 is taken "along" or parallel to a vertical fin that is formed from a semiconductor layer stack of layers 1302 through 1312 by patterning of a hard mask layer 1314. The formation of the vertical fin shown in FIG. 13 may be performed in a similar manner as that described above with respect to FIGS. 4A-6B.

The semiconductor stack includes layers 1302 through 1312 which are used for forming BJTs. In the description below, it is assumed that NPN BJTs are formed from the semiconductor stack of layers 1302 through 1312. It should be appreciated, however, that PNP BJTs may also be formed from the semiconductor stack of layers 1302 through 1312 by suitably altering the doping of the various layers described below.

The semiconductor stack includes a substrate 1302, which may be formed of similar materials and with similar sizing as that described above with respect to substrate 302. The substrate 1302, however may be very highly doped (e.g., n++ doped Si with a dopant concentration in the range of about $1e20/cm^3$ or above, as compared to n+ doped Si with a dopant concentration in the range of $1e18/cm^3$), and thus may also be referred to as n++ Si substrate 1302.

Semiconductor layer 1304 may be formed of n-type Si, and may also be referred to as n-type Si layer 1304. The n-type Si layer 1304 provides a collector 1301 for BJTs formed from the FIG. 13 structure, and thus may also be referred to as collector layer 1304. The n-type Si layer 1304 may have a height or vertical thickness (in direction Y-Y') in the range of about 5 nm to 50 nm, or about 50 nm to 500 nm.

Semiconductor layers 1306, 1308 and 1310 may be formed of SiGe with varying Ge %. Semiconductor layers 1306 and 1310, for example, may be formed of p-type SiGe with a relatively low Ge % (e.g., 10%) while semiconductor layer 1308 is formed of p-type SiGe with a relatively high Ge % (e.g., 30%). The semiconductor layers 1306, 1308 and 1310 may also be referred to as p-type SiGe layers 1306, 1308 and 1310. By suitably selecting the Ge % of layers 1306 through 1310 and the temperature used during the thermal anneal, a silicide may be selectively formed only on the semiconductor layer 1308, which provides a base 1303 for BJTs formed from the FIG. 13 structure. The semiconductor layer 1308 may also be referred to as base layer 1308. The p-type SiGe layer 1306 may have a height or vertical thickness (in direction Y-Y') in the range of about 5 nm to 50 nm, or about 50 nm to 500 nm, the p-type SiGe layer 1308 may have a height or vertical thickness (in direction Y-Y') in the range of about 5 nm to 50 nm, or about 50 nm to 500 nm, and the p-type SiGe layer 1310 may have a height or vertical thickness (in direction Y-Y') in the range of about 5 nm to 50 nm, or about 50 nm to 500 nm.

Semiconductor layer 1312 may be formed of very highly doped Si, and thus may also be referred to as n++ Si layer 1312. The semiconductor layer 1312 provides the emitter 1305 for BJTs formed from the FIG. 13 structure, and thus may also be referred to as emitter layer 1312. The n++ Si layer 1312 may have a height or vertical thickness (in direction Y-Y') in the range of about 5 nm to 50 nm, or about 50 nm to 500 nm.

The layers of the semiconductor stack of FIG. 13 may be formed using various processing. In some embodiments, the n++ Si substrate 1302 and n-type Si layer 1304 are formed via ion implantation, while the p-type SiGe layers 1306, 1308, and 1310 and the n++ Si layer 1312 are formed using epitaxial growth processes, where the dopants may be incorporated during epitaxial growth as described above. It should be appreciated, however, that various other techniques may be used to form the semiconductor stack shown in FIG. 13.

The hard mask layer 1314 may be formed of similar materials, with similar sizing and with similar processing as that described above with respect to hard mask layer 314. The vertical fin shown in FIG. 13 may be formed using a fin cut process, and the "length" of the vertical fin (in direction Z-Z') may be similar to the length of the vertical fins 401 described above.

The metal-doped $GeO_2$ layer 1316 may be formed using any suitable deposition process, including a conformal deposition process such as ALD. In some embodiments, the metal-doped $GeO_2$ layer 1316 is Y-doped $GeO_2$ (and thus may also be referred to as Y-doped $GeO_2$ layer 1316), although various other metal dopants may be used including Hf, Al, Sc, La, etc. as discussed above. The Y-doped $GeO_2$ layer 1316 may have a uniform thickness in the range of about 5 nm to 50 nm.

Figure 14:
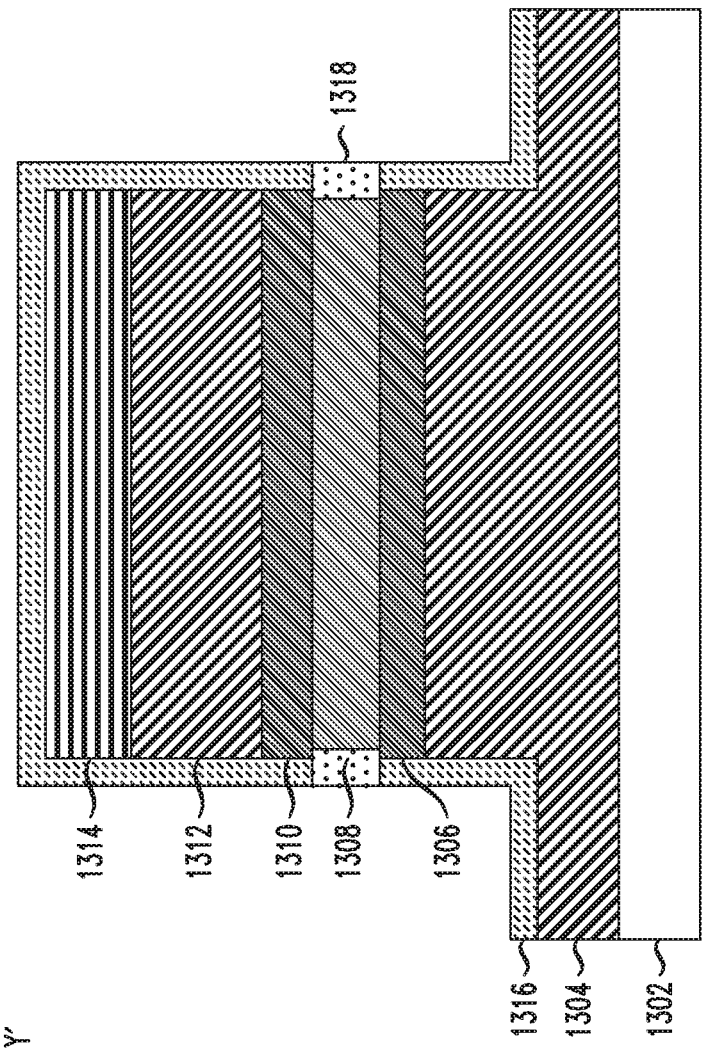
FIG. 14 depicts a cross-sectional view of the FIG. 13 structure following selective formation of a silicide from the metal-doped germanium oxide layer, according to an embodiment of the invention.

FIG. 14 shows a cross-sectional view 1400 of the FIG. 13 structure following selective formation of a silicide 1318 by conversion of the metal-doped $GeO_2$ layer 1316 adjacent sidewalls of the p-type SiGe layer 1308. Recall that the p-type SiGe layer 1308 has a higher Ge % concentration relative to p-type SiGe layers 1306 and 1310, and thus by tuning thermal anneal conditions the silicide 1318, which may be Y-silicide when layer 1316 is Y-doped $GeO_2$ and thus referred to as Y-silicide 1318, is only formed at the interface of the p-type SiGe layer 1308 and the Y-doped $GeO_2$ layer 1316. The unreacted Y-doped $GeO_2$ layer 1316 has dielectric properties, while the Y-silicide 1318 has metallic properties. This facilitates formation of contacts to the base 1303 (e.g., to p-type SiGe layer 1308) without shorting to the collector 1301 or emitter 1305. In some embodiments, the thermal anneal used to form Y-silicide 1318 occurs at a temperature below 600° C. in ambient $N_2$.

Figure 15:
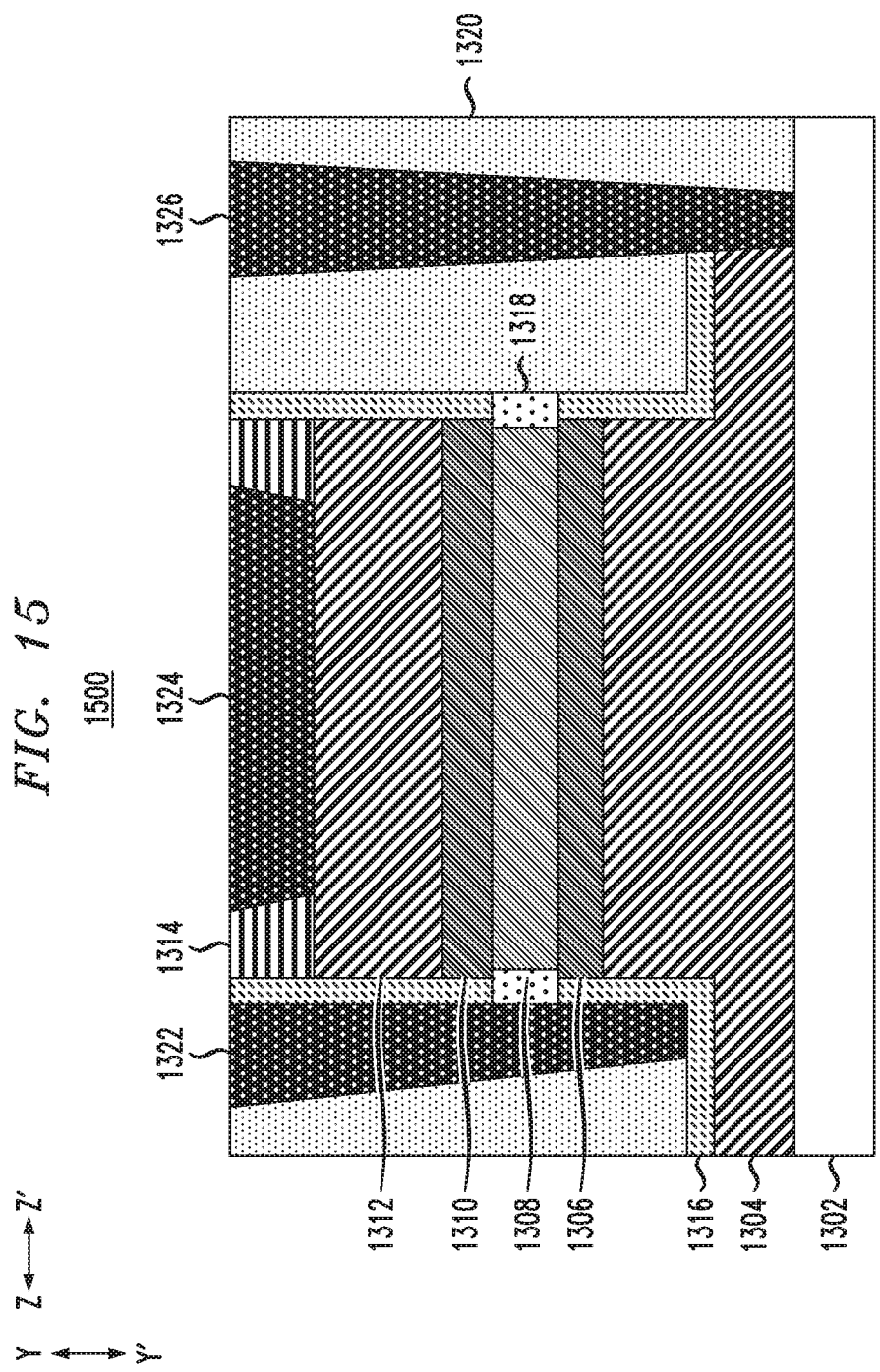
FIG. 15 depicts a cross-sectional view of the FIG. 14 structure following formation of base, emitter and collector contacts, according to an embodiment of the invention.

FIG. 15 shows a cross-sectional view 1500 of the FIG. 14 structure following formation of an oxide 1320, and following formation of a base contact 1322, an emitter contact 1324 and a collector contact 1326.

The oxide 1320 may be formed using similar materials as that described above with respect to oxide 316 (e.g., $SiO_2$). The oxide 1320 may be filled over the FIG. 13 structure, followed by planarization using CMP stopping on a top surface of the hard mask layer 1314, which removes portions of the Y-doped $GeO_2$ layer 1316 formed over the hard mask layer 1314 as illustrated.

The base contact 1322 is formed by a patterning an opening in the oxide 1320 adjacent one end of the fin, and filling contact material. The contact material may then be planarized using CMP or other suitable processing. The base contact 1322, also referred to as a sidewall base contact 1322, is self-aligned. The Y-silicide 1318 with metallic properties allows the sidewall base contact 1322 to form a contact to the p-type SiGe layer 1308, while the Y-doped $GeO_2$ layer 1316 on remaining portions of the sidewalls of the fin has dielectric properties thus preventing short to the collector 1301 and emitter 1305.

The emitter contact 1324 and collector contact 1326 are formed in a manner similar to that described above with respect to emitter contacts 326 and collector contact 328. The contact material used for base contact 1322, emitter contact 1324 and collector contact 1326 may be the same as the contact materials described above with respect to base contacts 324, emitter contacts 326 and collector contact 328.

In some embodiments, a method of forming a semiconductor structure comprises forming a semiconductor layer stack over a substrate. The semiconductor layer stack comprises at least one collector layer comprising Si providing a collector region for one or more BJTs, an emitter layer comprising Si providing an emitter region for the one or more BJTs, a base layer comprising SiGe with a first Ge % providing a base region for the one or more BJTs, and at least one additional semiconductor layer comprising SiGe with a second Ge % different than the first Ge %. The method also comprises forming one or more vertical fins in at least a portion of the semiconductor layer stack, and forming a GeOx layer over the one or more vertical fins. The method further comprises performing a thermal anneal to react at least a portion of the GeOx layer with SiGe having one of the first Ge % and the second Ge % to form a self-alignment layer, the self-alignment layer providing self-alignment for at least one contact to the base layer.

In some embodiments, forming the semiconductor layer stack comprises: forming a first semiconductor layer stack over the substrate; forming a sacrificial semiconductor layer over the first semiconductor layer, the sacrificial semiconductor layer comprising SiGe with the second Ge % and providing the at least one additional semiconductor layer, the second Ge % being higher than the first Ge %; forming a second semiconductor layer over the sacrificial semiconductor layer, the first and second semiconductor layers comprising Si and providing the at least one collector layer; forming a third semiconductor layer over the second semiconductor layer, the third semiconductor layer comprising SiGe with the first Ge % and providing the base layer; and forming a fourth semiconductor layer over the third semiconductor layer, the fourth semiconductor layer comprising Si and providing the emitter layer.

The method may further comprise patterning a hard mask layer over the fourth semiconductor layer, etching portions of the second, third and fourth semiconductor layers exposed by the patterned hard mask layer to form the one or more vertical fins, filling an oxide, planarizing the oxide to match a top surface of the patterned hard mask layer, and performing a fin cut of the one or more vertical fins by removing portions of the patterned hard mask layer at ends of the one or more vertical fins and etching exposed portions of the second, third and fourth semiconductor layers.

The method may further comprise recessing vertical sidewalls of the second and fourth semiconductor layers, forming inner spacer material using a conformal deposition process, the inner spacer material pinching off spaces formed by recessing the vertical sidewalls of the second and fourth semiconductor layers, and forming inner spacers in the spaces formed by recessing the vertical sidewalls of the second and fourth semiconductor layers by etching back the inner spacer material formed using the conformal deposition process.

The method may further comprise forming the GeOx layer using a conformal deposition process, forming bottom spacers by performing a thermal anneal that reacts portions of the GeOx layer adjacent the sacrificial semiconductor layer comprising SiGe with the first Ge %, and removing unreacted portions of the GeOx layer.

The method may further comprise forming a base region contact by filling contact material over the bottom spacers to contact sidewalls of the third semiconductor layer, forming an emitter region contact by removing a portion of the hard mask layer to expose a portion of the top surface of the fourth semiconductor layer and filling the contact material, and forming a collector region contact by patterning an opening in the oxide layer and the sacrificial semiconductor layer spaced apart from sidewalls of the one or more vertical fins and filling the contact material.

In other embodiments, forming the semiconductor stack comprises: forming a first semiconductor layer over the substrate, the first semiconductor layer comprising Si and providing the at least one collector layer; forming a second semiconductor layer over the first semiconductor layer; forming a third semiconductor layer over the second semiconductor layer, the third semiconductor layer comprising SiGe with the first Ge % and providing the base layer; forming a fourth semiconductor layer over the third semiconductor layer, the second and fourth semiconductor layers comprising SiGe with the second Ge % and providing the at least one additional semiconductor layer, the second Ge % being lower than the first Ge %; and forming a fifth semiconductor layer over the fourth semiconductor layer, the fifth semiconductor layer comprising Si and providing the emitter layer.

The method may further comprise patterning a hard mask layer over the fifth semiconductor layer, and etching portions of the first, second, third and fourth semiconductor layers exposed by the patterned hard mask layer to form the one or more vertical fins. The GeOx layer comprises a metal-doped GeOx layer, and forming the GeOx layer comprises forming the metal-doped GeOx layer using a conformal deposition process. The metal-doped GeOx layer may comprise Y-doped GeOx.

The method may further comprise forming a silicide from portions of the metal-doped GeOx layer adjacent sidewalls of the third semiconductor layer using a thermal anneal that selectively converts the metal-doped GeOx layer adjacent the third semiconductor layer comprising SiGe with the first Ge %.

The method may further comprise filling an oxide, forming a base region contact by patterning an opening in the oxide adjacent a first end of the one or more vertical fins and filing contact material over the exposed metal-doped GeOx layer and silicide layer, forming an emitter region contact by removing a portion of the hard mask layer to expose a portion of the top surface of the fifth semiconductor layer and filling the contact material, and forming a collector region contact by patterning an opening in the oxide layer, the metal-doped GeOx layer and the first semiconductor layer spaced apart from a second end of the one or more vertical fins and filling the contact material.

In another embodiment, a semiconductor structure comprises a substrate and one or more vertical fins disposed over a top surface of the substrate. The one or more vertical fins comprise a semiconductor layer stack comprising at least one collector layer comprising Si providing a collector region for one or more BJTs, an emitter layer comprising Si providing an emitter region for the one or more BJTs, a base layer comprising SiGe with a first Ge % providing a base region for the one or more BJTs, and at least one additional semiconductor layer comprising SiGe with a second Ge % different than the first Ge %. The semiconductor structure also comprises a self-alignment layer comprising a reacted portion of a GeOx layer and SiGe having one of the first Ge % and the second Ge %, the self-alignment layer providing self-alignment for at least one contact to the base layer.

In some embodiments, the semiconductor layer stack comprises a first semiconductor layer over the substrate, a sacrificial semiconductor layer over the first semiconductor layer, a second semiconductor layer over the sacrificial semiconductor layer, a third semiconductor layer over the second semiconductor layer, and a fourth semiconductor layer over the third semiconductor layer. The first and second semiconductor layers comprise Si and provide the at least one collector layer, the third semiconductor layer comprises SiGe with the first Ge % and provides the base layer, the fourth semiconductor layer comprises Si and provides the emitter layer, and the sacrificial semiconductor layer comprises SiGe with the second Ge % and provides the at least one additional semiconductor layer, the second Ge % being higher than the first Ge %. The self-alignment layer comprises $SiO_2$, the self-alignment layer being disposed adjacent the sacrificial semiconductor layer at ends of one or more vertical fins.

In other embodiments, the semiconductor stack comprises a first semiconductor layer over the substrate, a second semiconductor layer over the first semiconductor layer, a third semiconductor layer over the second semiconductor layer, a fourth semiconductor layer over the third semiconductor layer, and a fifth semiconductor layer over the fourth semiconductor layer. The first semiconductor layer comprises Si and provides the at least one collector layer, the third semiconductor layer comprises SiGe with the first Ge % and provides the base layer, the fifth semiconductor layer comprises Si and provides the emitter layer, and the second and fourth semiconductor layers comprise SiGe with the second Ge % and provide that at least one additional semiconductor layer, the second Ge % being lower than the first Ge %. The self-alignment layer comprises a silicide, the self-alignment layer being disposed adjacent ends of the third semiconductor layer.

In another embodiment, an integrated circuit comprises a BJT structure comprising a substrate and one or more vertical fins disposed over a top surface of the substrate. The one or more vertical fins comprise a semiconductor layer stack comprising at least one collector layer comprising Si providing a collector region for one or more BJTs, an emitter layer comprising Si providing an emitter region for the one or more BJTs, a base layer comprising SiGe with a first Ge % providing a base region for the one or more BJTs, and at least one additional semiconductor layer comprising SiGe with a second Ge % different than the first Ge %. The BJT structure further comprises a self-alignment layer comprising a reacted portion of a GeOx layer and SiGe having one of the first Ge % and the second Ge %, the self-alignment layer providing self-alignment for at least one contact to the base layer.

In some embodiments, the semiconductor layer stack comprises a first semiconductor layer over the substrate, a sacrificial semiconductor layer over the first semiconductor layer, a second semiconductor layer over the sacrificial semiconductor layer, a third semiconductor layer over the second semiconductor layer, and a fourth semiconductor layer over the third semiconductor layer. The first and second semiconductor layers comprise Si and provide the at least one collector layer, the third semiconductor layer comprises SiGe with the first Ge % and provides the base layer, the fourth semiconductor layer comprises Si and provides the emitter layer, and the sacrificial semiconductor layer comprises SiGe with the second Ge % and provides the at least one additional semiconductor layer, the second Ge % being higher than the first Ge %. The self-alignment layer comprises $SiO_2$, the self-alignment layer being disposed adjacent the sacrificial semiconductor layer at ends of one or more vertical fins.

In other embodiments, the semiconductor stack comprises a first semiconductor layer over the substrate, a second semiconductor layer over the first semiconductor layer, a third semiconductor layer over the second semiconductor layer, a fourth semiconductor layer over the third semiconductor layer, and a fifth semiconductor layer over the fourth semiconductor layer. The first semiconductor layer comprises Si and provides the at least one collector layer, the third semiconductor layer comprises SiGe with the first Ge % and provides the base layer, the fifth semiconductor layer comprises Si and provides the emitter layer, and the second and fourth semiconductor layers comprise SiGe with the second Ge % and provide that at least one additional semiconductor layer, the second Ge % being lower than the first Ge %. The self-alignment layer comprises a silicide, the self-alignment layer being disposed adjacent ends of the third semiconductor layer.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a semiconductor layer stack over a substrate, the semiconductor layer stack comprising at least one collector layer comprising silicon providing a collector region for one or more bipolar junction transistors, an emitter layer comprising silicon providing an emitter region for the one or more bipolar junction transistors, a base layer comprising silicon germanium with a first germanium percentage providing a base region for the one or more bipolar junction transistors, and at least one additional semiconductor layer comprising silicon germanium with a second germanium percentage different than the first germanium percentage;
    forming one or more vertical fins in at least a portion of the semiconductor layer stack;
    forming a germanium oxide layer over the one or more vertical fins; and
    performing a thermal anneal to react at least a portion of the germanium oxide layer with silicon germanium having one of the first germanium percentage and the second germanium percentage to form a self-alignment layer, the self-alignment layer providing self-alignment for at least one contact to the base layer.

2. The method of claim 1, wherein forming the semiconductor layer stack comprises:
    forming a first semiconductor layer stack over the substrate;
    forming a sacrificial semiconductor layer over the first semiconductor layer, the sacrificial semiconductor layer comprising silicon germanium with the second germanium percentage and providing the at least one additional semiconductor layer, the second germanium percentage being higher than the first germanium percentage;
    forming a second semiconductor layer over the sacrificial semiconductor layer, the first and second semiconductor layers comprising silicon and providing the at least one collector layer;
    forming a third semiconductor layer over the second semiconductor layer, the third semiconductor layer comprising silicon germanium with the first germanium percentage and providing the base layer; and
    forming a fourth semiconductor layer over the third semiconductor layer, the fourth semiconductor layer comprising silicon and providing the emitter layer.

3. The method of claim 2, further comprising:
    patterning a hard mask layer over the fourth semiconductor layer;
    etching portions of the second, third and fourth semiconductor layers exposed by the patterned hard mask layer to form the one or more vertical fins;
    filling an oxide;
    planarizing the oxide to match a top surface of the patterned hard mask layer; and
    performing a fin cut of the one or more vertical fins by removing portions of the patterned hard mask layer at ends of the one or more vertical fins and etching exposed portions of the second, third and fourth semiconductor layers.

4. The method of claim 3, further comprising:
    recessing vertical sidewalls of the second and fourth semiconductor layers;
    forming inner spacer material using a conformal deposition process, the inner spacer material pinching off spaces formed by recessing the vertical sidewalls of the second and fourth semiconductor layers; and
    forming inner spacers in the spaces formed by recessing the vertical sidewalls of the second and fourth semiconductor layers by etching back the inner spacer material formed using the conformal deposition process.

5. The method of claim 4, further comprising:
    forming the germanium oxide layer using a conformal deposition process;
    forming bottom spacers by performing a thermal anneal that reacts portions of the germanium oxide layer adjacent the sacrificial semiconductor layer comprising silicon germanium with the second germanium percentage; and removing unreacted portions of the germanium oxide layer.

6. The method of claim 5, further comprising:

forming a base region contact by filling contact material over the bottom spacers to contact sidewalls of the third semiconductor layer;

forming an emitter region contact by removing a portion of the hard mask layer to expose a portion of the top surface of the fourth semiconductor layer and filling the contact material; and forming a collector region contact by patterning an opening in the oxide layer and the sacrificial semiconductor layer spaced apart from sidewalls of the one or more vertical fins and filling the contact material.

7. The method of claim 1, wherein forming the semiconductor stack comprises:

forming a first semiconductor layer over the substrate, the first semiconductor layer comprising silicon and providing the at least one collector layer;

forming a second semiconductor layer over the first semiconductor layer;

forming a third semiconductor layer over the second semiconductor layer, the third semiconductor layer comprising silicon germanium with the first germanium percentage and providing the base layer;

forming a fourth semiconductor layer over the third semiconductor layer, the second and fourth semiconductor layers comprising silicon germanium with the second germanium percentage and providing the at least one additional semiconductor layer, the second germanium percentage being lower than the first germanium percentage; and forming a fifth semiconductor layer over the fourth semiconductor layer, the fifth semiconductor layer comprising silicon and providing the emitter layer.

8. The method of claim 7, further comprising:

patterning a hard mask layer over the fifth semiconductor layer; and etching portions of the first, second, third and fourth semiconductor layers exposed by the patterned hard mask layer to form the one or more vertical fins.

9. The method of claim 8, wherein the germanium oxide layer comprises a metal-doped germanium oxide layer, and wherein forming the germanium oxide layer comprises forming the metal-doped germanium oxide layer using a conformal deposition process.

10. The method of claim 9, wherein the metal-doped germanium oxide layer comprises yttrium-doped germanium oxide.

11. The method of claim 9, further comprising forming a silicide from portions of the metal-doped germanium oxide layer adjacent sidewalls of the third semiconductor layer using a thermal anneal that selectively converts the metal-doped germanium oxide layer adjacent the third semiconductor layer comprising silicon germanium with the first germanium percentage.

12. The method of claim 11, further comprising:

filling an oxide;

forming a base region contact by patterning an opening in the oxide adjacent a first end of the one or more vertical fins and filing contact material over the exposed metal-doped germanium oxide layer and silicide layer;

forming an emitter region contact by removing a portion of the hard mask layer to expose a portion of the top surface of the fifth semiconductor layer and filling the contact material; and forming a collector region contact by patterning an opening in the oxide layer, the metal-doped germanium oxide layer and the first semiconductor layer spaced apart from a second end of the one or more vertical fins and filling the contact material.

13. A semiconductor structure, comprising:

a substrate;

one or more vertical fins disposed over a top surface of the substrate, the one or more vertical fins comprising a semiconductor layer stack comprising at least one collector layer comprising silicon providing a collector region for one or more bipolar junction transistors, an emitter layer comprising silicon providing an emitter region for the one or more bipolar junction transistors, a base layer comprising silicon germanium with a first germanium percentage providing a base region for the one or more bipolar junction transistors, and at least one additional semiconductor layer comprising silicon germanium with a second germanium percentage different than the first germanium percentage; and a self-alignment layer comprising a reacted portion of a germanium oxide layer and silicon germanium having one of the first germanium percentage and the second germanium percentage, the self-alignment layer providing self-alignment for at least one contact to the base layer.

14. The semiconductor structure of claim 13, wherein:

the semiconductor layer stack comprises a first semiconductor layer over the substrate, a sacrificial semiconductor layer over the first semiconductor layer, a second semiconductor layer over the sacrificial semiconductor layer, a third semiconductor layer over the second semiconductor layer, and a fourth semiconductor layer over the third semiconductor layer;

the first and second semiconductor layers comprise silicon and provide the at least one collector layer;

the third semiconductor layer comprises silicon germanium with the first germanium percentage and provides the base layer;

the fourth semiconductor layer comprises silicon and provides the emitter layer; and the sacrificial semiconductor layer comprises silicon germanium with the second germanium percentage and provides the at least one additional semiconductor layer, the second germanium percentage being higher than the first germanium percentage.

15. The semiconductor structure of claim 13, wherein the self-alignment layer comprises silicon dioxide, the self-alignment layer being disposed adjacent the sacrificial semiconductor layer at ends of one or more vertical fins.

16. The semiconductor structure of claim 13, wherein:

the semiconductor stack comprises a first semiconductor layer over the substrate, a second semiconductor layer over the first semiconductor layer, a third semiconductor layer over the second semiconductor layer, a fourth semiconductor layer over the third semiconductor layer, and a fifth semiconductor layer over the fourth semiconductor layer;

the first semiconductor layer comprises silicon and provides the at least one collector layer;

the third semiconductor layer comprises silicon germanium with the first germanium percentage and provides the base layer;

the fifth semiconductor layer comprises silicon and provides the emitter layer; and the second and fourth semiconductor layers comprise silicon germanium with the first germanium percentage and provides that at least one additional semiconductor layer, the second germanium percentage being lower than the first germanium percentage.

17. The semiconductor structure of claim 13, wherein the self-alignment layer comprises a silicide, the self-alignment layer being disposed adjacent ends of the third semiconductor layer.

18. An integrated circuit comprising:
a bipolar junction transistor structure comprising:
   a substrate;
   one or more vertical fins disposed over a top surface of the substrate, the one or more vertical fins comprising a semiconductor layer stack comprising at least one collector layer comprising silicon providing a collector region for one or more bipolar junction transistors, an emitter layer comprising silicon providing an emitter region for the one or more bipolar junction transistors, a base layer comprising silicon germanium with a first germanium percentage providing a base region for the one or more bipolar junction transistors, and at least one additional semiconductor layer comprising silicon germanium with a second germanium percentage different than the first germanium percentage; and
a self-alignment layer comprising a reacted portion of a germanium oxide layer and silicon germanium having one of the first germanium percentage and the second germanium percentage, the self-alignment layer providing self-alignment for at least one contact to the base layer.

19. The integrated circuit of claim 18, wherein:
the semiconductor layer stack comprises a first semiconductor layer over the substrate, a sacrificial semiconductor layer over the first semiconductor layer, a second semiconductor layer over the sacrificial semiconductor layer, a third semiconductor layer over the second semiconductor layer, and a fourth semiconductor layer over the third semiconductor layer;

the first and second semiconductor layers comprise silicon and provide the at least one collector layer;

the third semiconductor layer comprises silicon germanium with the first germanium percentage and provides the base layer;

the fourth semiconductor layer comprises silicon and provides the emitter layer;

the sacrificial semiconductor layer comprises silicon germanium with the second germanium percentage and provides the at least one additional semiconductor layer, the second germanium percentage being higher than the first germanium percentage; and the self-alignment layer comprises silicon dioxide, the self-alignment layer being disposed adjacent the sacrificial semiconductor layer at ends of one or more vertical fins.

20. The integrated circuit of claim 18, wherein:
the semiconductor stack comprises a first semiconductor layer over the substrate, a second semiconductor layer over the first semiconductor layer, a third semiconductor layer over the second semiconductor layer, a fourth semiconductor layer over the third semiconductor layer, and a fifth semiconductor layer over the fourth semiconductor layer;

the first semiconductor layer comprises silicon and provides the at least one collector layer;

the third semiconductor layer comprises silicon germanium with the first germanium percentage and provides the base layer;

the fifth semiconductor layer comprises silicon and provides the emitter layer;

the second and fourth semiconductor layers comprise silicon germanium with the first germanium percentage and provides that at least one additional semiconductor layer, the second germanium percentage being lower than the first germanium percentage; and the self-alignment layer comprises a silicide, the self-alignment layer being disposed adjacent ends of the third semiconductor layer.

* * * * *